US011937399B2

(12) United States Patent
Zhang et al.

(10) Patent No.: US 11,937,399 B2
(45) Date of Patent: Mar. 19, 2024

(54) SERVER, LIQUID COOLING DEVICE AND COLD PLATE ASSEMBLY

(71) Applicants: SQ Technology(Shanghai) Corporation, Shanghai (CN); INVENTEC CORPORATION, Taipei (TW)

(72) Inventors: Shuai Zhang, Shanghai (CN); Zhao Geng, Shanghai (CN); Fanpu He, Shanghai (CN)

(73) Assignees: SQ TECHNOLOGY(SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 56 days.

(21) Appl. No.: 17/839,721

(22) Filed: Jun. 14, 2022

(65) Prior Publication Data

US 2023/0276599 A1    Aug. 31, 2023

(30) Foreign Application Priority Data

Feb. 28, 2022   (CN) .......................... 202210188950.6

(51) Int. Cl.
*H05K 7/20*      (2006.01)
*F28F 3/12*      (2006.01)

(52) U.S. Cl.
CPC ..... *H05K 7/20254* (2013.01); *H05K 7/20727* (2013.01); *H05K 7/20772* (2013.01); *F28F 3/12* (2013.01); *H05K 7/20272* (2013.01)

(58) Field of Classification Search
CPC ........... H05K 7/20772; H05K 7/20781; H05K 7/20272; H05K 7/20254; H05K 7/20727
See application file for complete search history.

(56) References Cited

U.S. PATENT DOCUMENTS

| 3,481,393 | A | * | 12/1969 | Chu | ......................... | H01L 25/03 |
| | | | | | | 165/104.31 |
| 7,508,676 | B1 | * | 3/2009 | Samaniego | ........... | F28F 9/0246 |
| | | | | | | 361/728 |
| 8,937,810 | B2 | * | 1/2015 | Brunschwiler | .... | H05K 7/20772 |
| | | | | | | 165/185 |
| 10,477,725 | B2 | * | 11/2019 | Chen | .................. | H05K 7/20272 |
| 10,704,983 | B1 | * | 7/2020 | Tian | ........................ | H01R 12/75 |
| 10,952,354 | B1 | * | 3/2021 | Chen | ........................ | H01L 23/46 |

FOREIGN PATENT DOCUMENTS

CN   109521860 A   *   3/2019
CN   113805683 A   *   12/2021

* cited by examiner

*Primary Examiner* — Zachary Pape
(74) *Attorney, Agent, or Firm* — Locke Lord LLP; Tim Tingkang Xia, Esq.

(57) ABSTRACT

A liquid cooling device includes first cold plates, second cold plates, a water divider, a first inlet pipe, a first outlet pipe, first connection pipes, second inlet pipes, second outlet pipes, second connection pipes. The water divider has inner inlet connectors and inner outlet connectors. The first inlet pipe connects one inner inlet connector and one first cold plate. The first outlet pipe connects one inner outlet connector and another one first cold plate. The first connection pipes each connect different two of the other first cold plates. The second inlet pipes respectively connect the other inner inlet connectors and some second cold plates. The second outlet pipes respectively connect the other inner outlet connectors and some second cold plates. The second connection pipes each connect different two second cold plates.

7 Claims, 6 Drawing Sheets

SERVER, LIQUID COOLING DEVICE AND COLD PLATE ASSEMBLY

CROSS-REFERENCE TO RELATED APPLICATIONS

This non-provisional application claims priority under 35 U.S.C. § 119(a) on Patent Application No(s). 202210188950.6 filed in China, on Feb. 28, 2022, the entire contents of which are hereby incorporated by reference.

BACKGROUND OF THE INVENTION

Technical Field of the Invention

The invention relates to a server, a liquid cooling device, and a cold plate assembly.

Description of the Related Art

In general, a computer or a server has a casing, a power supply, a motherboard, a central processing unit, a graphics card, and an expansion card. The power supply and the motherboard are mounted in the casing, and the central processing unit, the graphics card, and the expansion card are mounted on the motherboard. When the computer is in operation, the central processing unit performs data computation, and the graphics card processes an image, and both of them may produce a large amount of heat. Therefore, the computer manufacturer may add a fan to dissipate heat generated from the central processing unit or the graphics card.

However, the fan is insufficient to provide a desirable heat dissipation requirement of the computer or the server. Therefore, how to improve the heat dissipation efficiency of the computer or the server is one of the crucial topics in this field.

SUMMARY OF THE INVENTION

The invention provides a server, a liquid cooling device, and a cold plate assembly which are capable of improving the heat dissipation efficiency of the computer or the server.

One embodiment of the invention provides a cold plate assembly configured to be engaged with a pick-and-place tool. The cold plate assembly includes a cold plate and an assistance bracket. The assistance bracket is mounted on the cold plate and has an engagement hole. The engagement hole is configured to be engaged with the pick-and-place tool.

Another embodiment of the invention provides a liquid cooling device. The liquid cooling device includes a plurality of first cold plates, a plurality of second cold plates, a water divider, a first inlet pipe, a first outlet pipe, a plurality of first connection pipes, a plurality of second inlet pipes, a plurality of second outlet pipes, a plurality of second connection pipes. The first cold plates each has a first fluid inlet and a first fluid outlet. The second cold plates each has a second fluid inlet and a second fluid outlet. The water divider has an outer inlet connector, an outer outlet connector, a plurality of inner inlet connectors, and a plurality of inner outlet connectors. The inner inlet connectors are in fluid communication with the outer inlet connector, and the inner outlet connectors are in fluid communication with the outer outlet connector. The first inlet pipe connects one of the inner inlet connectors and the first fluid inlet of one of the first cold plates. The first outlet pipe connects one of the inner outlet connectors and the first fluid outlet of another one of the first cold plates. The first connection pipes each connect the first fluid inlet and the first fluid outlet of different two of the others of the first cold plates. The second inlet pipes respectively connect the others of the inner inlet connectors and the second fluid inlets of some of the second cold plates. The second outlet pipes respectively connect the others of the inner outlet connectors and the second fluid outlets of some of the second cold plates. The second connection pipes each connect the second fluid inlet and the second fluid outlet of different two of the others of the second cold plates.

Still another embodiment of the invention provides a server. The server includes a casing, a motherboard, a plurality of graphics chips, a plurality of bridge chips, and a liquid cooling device. The motherboard is disposed in the casing. The graphics chips are disposed on the motherboard. The bridge chips are disposed on the motherboard and connected to the graphics chips. The liquid cooling device is disposed in the casing and includes a plurality of first cold plates, a plurality of second cold plates, a water divider, a first inlet pipe, a first outlet pipe, a plurality of first connection pipes, a plurality of second inlet pipes, a plurality of second outlet pipes, a plurality of second connection pipes. The first cold plates are respectively and thermally coupled to the bridge chips and each has a first fluid inlet and a first fluid outlet. The second cold plates are respectively and thermally coupled to the graphics chips and each has a second fluid inlet and a second fluid outlet. The water divider has an outer inlet connector, an outer outlet connector, a plurality of inner inlet connectors, and a plurality of inner outlet connectors. The inner inlet connectors are in fluid communication with the outer inlet connector, and the inner outlet connectors are in fluid communication with the outer outlet connector. The first inlet pipe connects one of the inner inlet connectors and the first fluid inlet of one of the first cold plates. The first outlet pipe connects one of the inner outlet connectors and the first fluid outlet of another one of the first cold plates. The first connection pipes each connect the first fluid inlet and the first fluid outlet of different two of the others of the first cold plates. The second inlet pipes respectively connect the others of the inner inlet connectors and the second fluid inlets of some of the second cold plates. The second outlet pipes respectively connect the others of the inner outlet connectors and the second fluid outlets of some of the second cold plates. The second connection pipes each connect the second fluid inlet and the second fluid outlet of different two of the others of the second cold plates.

According to the server, the liquid cooling device, and the cold plate assembly as discussed in the above embodiments, the liquid cooling device is provided in the server, such that the heat dissipation requirement can be satisfied while reducing the quantity of fans or reducing the rotation speed of the fans, thereby reducing noise generated from the fans.

Moreover, since coolant flowing in the liquid cooling device has a desirable specific heat capacity and a high heat conductivity, heat transfer efficiency of the coolant is approximately 1000 to 3000 times of that of air. Therefore, the liquid cooling device provided in the server can be disposed on the main heat source, and other heat sources may be still cooled by the fans, which improves the heat dissipation efficiency of the server.

Furthermore, since the heat dissipation efficiency of liquid cooling per volume is better than the heat dissipation efficiency of air cooling per volume, in the same heat dissipation efficiency, the volume of the liquid cooling device is smaller than that of the air cooling device. Therefore, the liquid cooling device is prevented from interfering installations or removals of components in the server.

In addition, the first cold plates and the second cold plates are connected to the same water divider, such that the quantity of quick connectors can be reduced, and the coolant can preferentially flow through the second cold plates thermally coupled to the graphics chips that consume more power, thereby increasing the heat dissipation efficiency of the liquid cooling device.

On the other hand, the assistance bracket is provided on the cold plate, such that the assistance bracket facilitates the installation or removal of the cold plate by using the pick-and-place tool.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
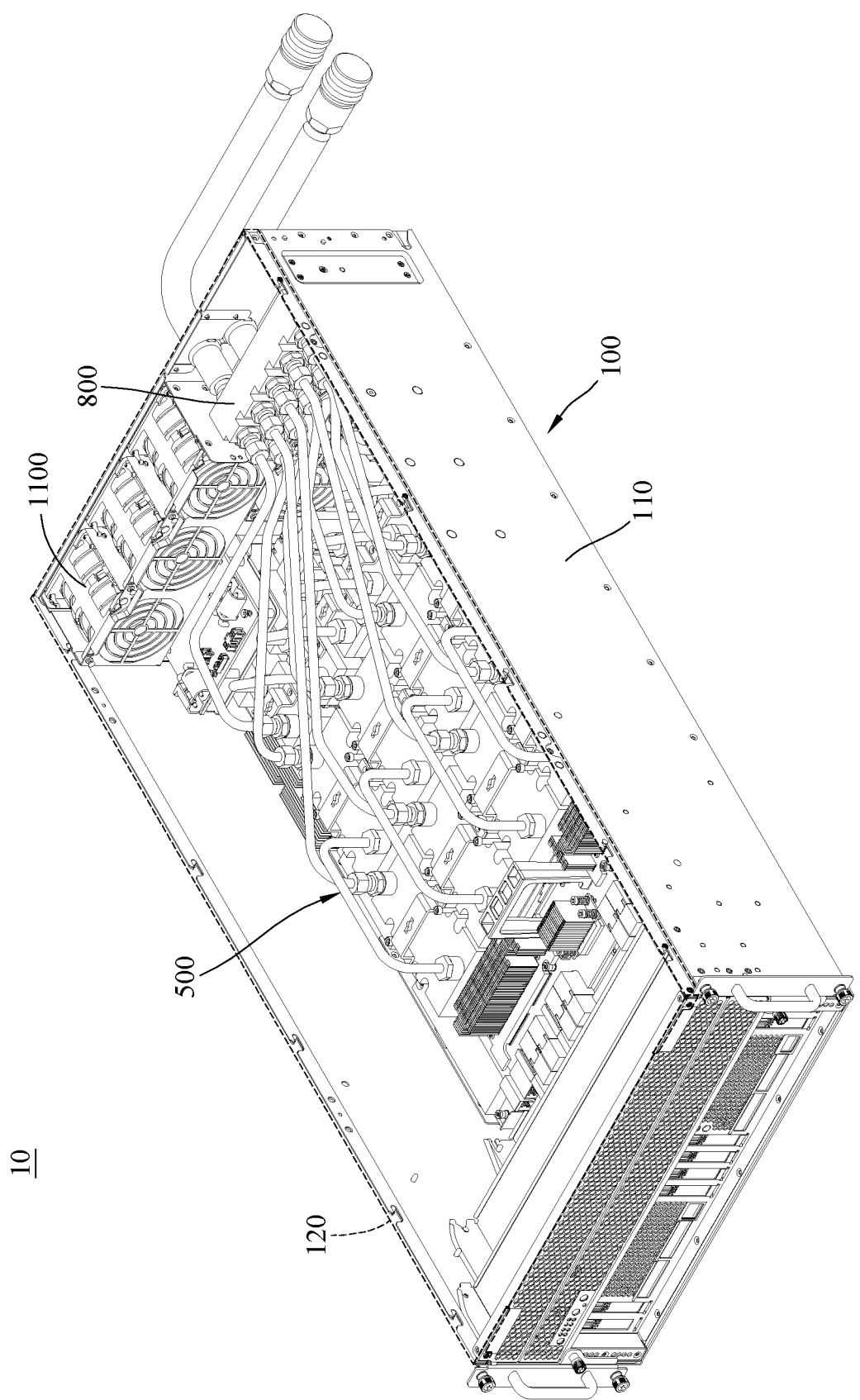
FIG. 1 is a perspective view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
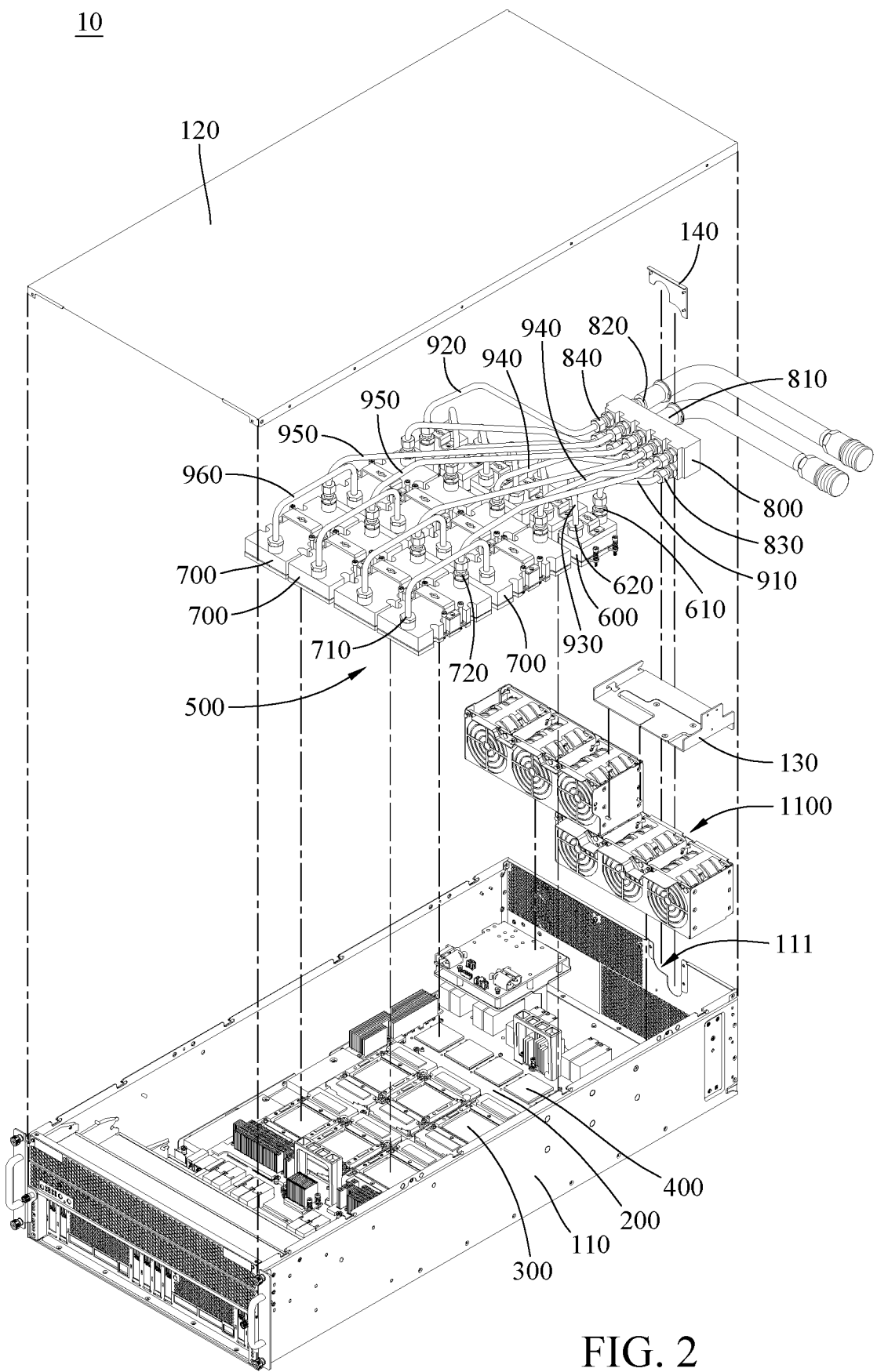
FIG. 2 is an exploded view of the server in FIG. 1.
Figure 3:
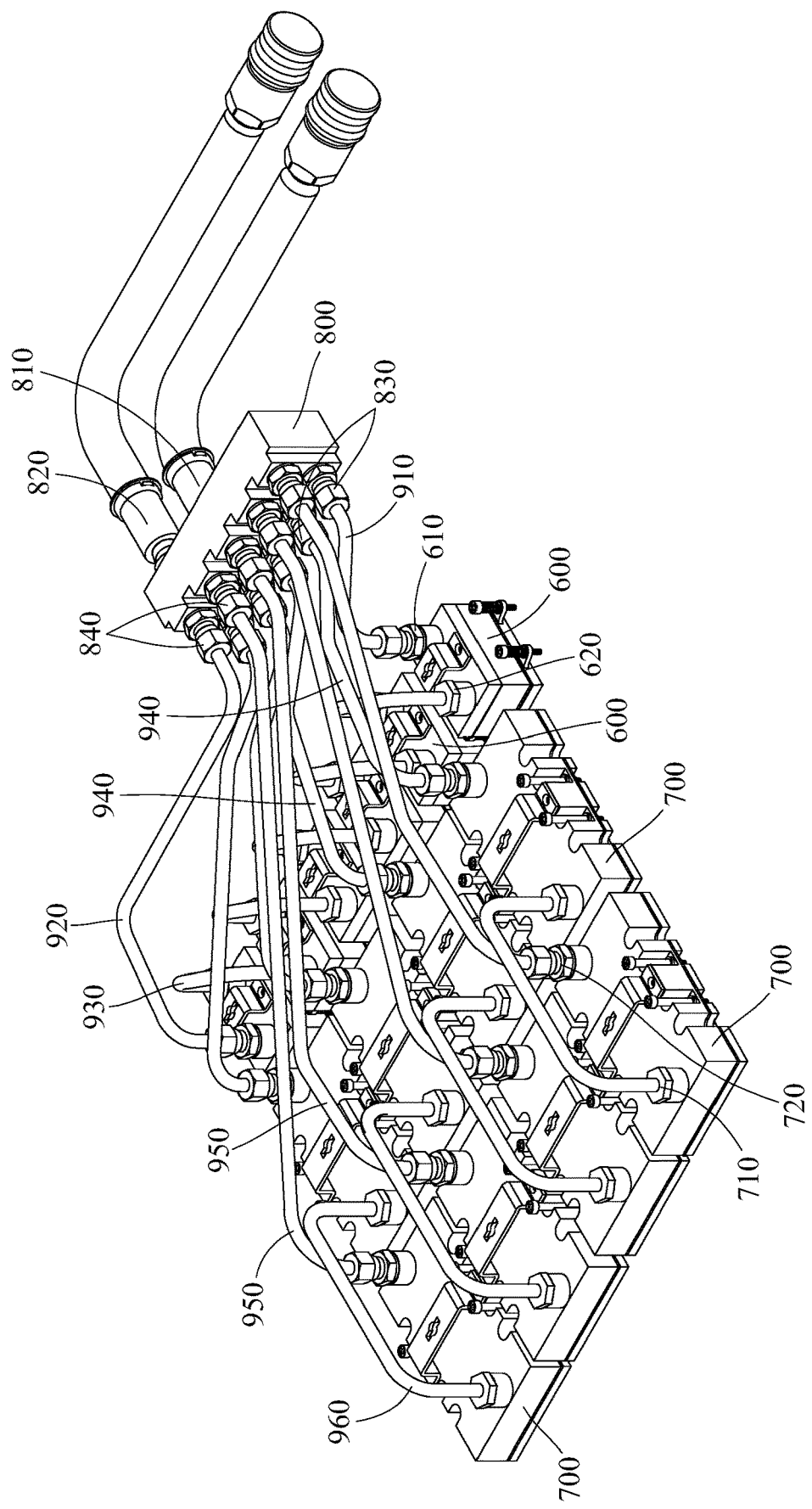
FIG. 3 is a perspective view of a liquid cooling device of the server in FIG. 2.
Figure 4:
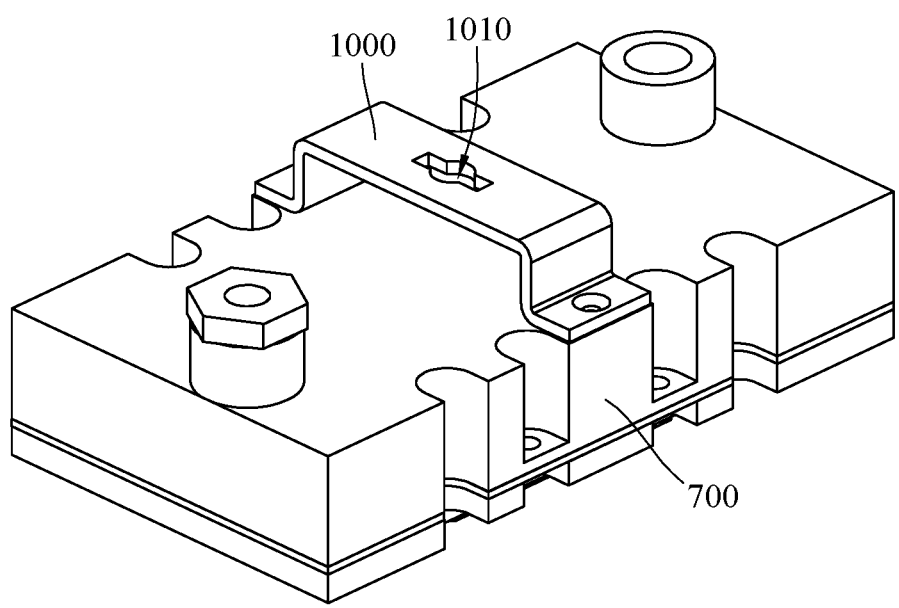
FIG. 4 is a perspective view of a cold plate assembly of the liquid cooling device in FIG. 2.

Refer to FIGS. 1 to 4, where FIG. 1 is a perspective view of a server 10 according to one embodiment of the invention, FIG. 2 is an exploded view of the server 10 in FIG. 1, FIG. 3 is a perspective view of a liquid cooling device 500 of the server 10 in FIG. 2, and FIG. 4 is a perspective view of a cold plate assembly of the liquid cooling device 500 in FIG. 2.

In this embodiment, the server 10 includes a casing 100, a motherboard 200, a plurality of graphics chips 300, a plurality of bridge chips 400, and a liquid cooling device 500.

The casing 100 includes a base 110, a cover 120, a support 130, and a bracket 140. The base 110 is configured to accommodate components, such as the motherboard 200. The cover 120 is removably mounted on the base 110 so as to cover the components, such as the motherboard 200. The support 130 is removably mounted on the base 110 so as to support a part of the liquid cooling device 500. The bracket 140 is removably mounted on the base 110, and the bracket 140 and the base 110 together surround a space for pipes of the liquid cooling device 500 to be disposed therethrough.

The motherboard 200 is disposed in the base 110 of the casing 100. The graphics chips 300 and the bridge chips 400 are disposed on the motherboard 200, and the bridge chips 400 are connected to the graphics chips 300.

In this embodiment, the graphics chips 300 includes eight graphics chips 300, but the invention is not limited thereto; in some other embodiments, the graphics chips may include six graphics chips or graphics chips of another number. Moreover, the bridge chips 400 includes six bridge chips 400, but the invention is not limited thereto; in some other embodiments, the bridge chips may include four bridge chips or bridge chips of another number.

The liquid cooling device 500 is disposed in the casing 100 and includes a plurality of first cold plates 600, a plurality of second cold plates 700, a water divider 800, a first inlet pipe 910, a first outlet pipe 920, a plurality of first connection pipes 930, a plurality of second inlet pipes 940, a plurality of second inlet pipes 940, and a plurality of second connection pipes 960. The first cold plates 600 are respectively and thermally coupled to the bridge chips 400. The first cold plates 600 each have a first fluid inlet 610 and a first fluid outlet 620 that are in fluid communication with a chamber (not shown) thereof. A quantity of the first cold plates 600 mates the quantity of the bridge chips 400; that is, the first cold plates 600, for example, includes six first cold plates 600. The first cold plates 600 are arranged in a straight line.

The second cold plates 700 are respectively and thermally coupled to the graphics chips 300. The second cold plates 700 each have a second fluid inlet 710 and a second fluid outlet 720 that are in fluid communication with a chamber (not shown) thereof. Moreover, the quantity of the second cold plates 700 mates the quantity of the graphics chips 300; that is, the second cold plates 700, for example, includes eight second cold plates 700. The second cold plates 700 are arranged in an array of 2×4.

In this embodiment, each of the first cold plates 600 is made of one single piece, and each of the second cold plates 700 is made of one single piece for achieving sealing thereof and preventing leakage from occurring.

The water divider 800 is stacked on the support 130 and has an outer inlet connector 810, an outer outlet connector 820, a plurality of inner inlet connectors 830, and a plurality of inner outlet connectors 840. The inner inlet connectors 830 are in fluid communication with the outer inlet connector 810, and the inner outlet connectors 840 are in fluid communication with the outer outlet connector 820.

The first inlet pipe 910 connects one of the inner inlet connectors 830 and the first fluid inlet 610 of one of the first cold plates 600. The first outlet pipe 920 connects one of the inner outlet connector 840 and the first fluid outlet 620 of another one of the first cold plates 600. Each of the first connection pipes 930 respectively connects the first fluid inlet 610 and the first fluid outlet 620 of different two of the others of the first cold plates 600. The second inlet pipes 940 respectively connect the others of the inner inlet connectors 830 and the second fluid inlets 710 of some of the second cold plates 700. The second outlet pipes 950 respectively connect the others of the inner outlet connectors 840 and the second fluid outlets 720 of some of the second cold plates 700. Each of the second connection pipes 960 respectively connects the second fluid inlet 710 and the second fluid outlet 720 of different two of the others of the second cold plates 700.

In this embodiment, the server 10 may further include a fan assembly 1100. The fan assembly 1100 is mounted in the casing 100 and is configured to generate an airflow towards the motherboard 200 for dissipate heat generated from the motherboard 200.

In this embodiment, the server 10 may further include a plurality of assistance brackets 1000. The assistance brackets 1000 are respectively fixed on the first cold plates 600 and the second cold plates 700 via screws. Each of the assistance brackets 1000 has an engagement hole 1010, where the engagement hole 1010 is, for example, in an elongated shape. Each of the assistance brackets 1000 and one cold plate (e.g., the first cold plate 600 or the second cold plate 700) together form a cold plate assembly.

Figure 5:
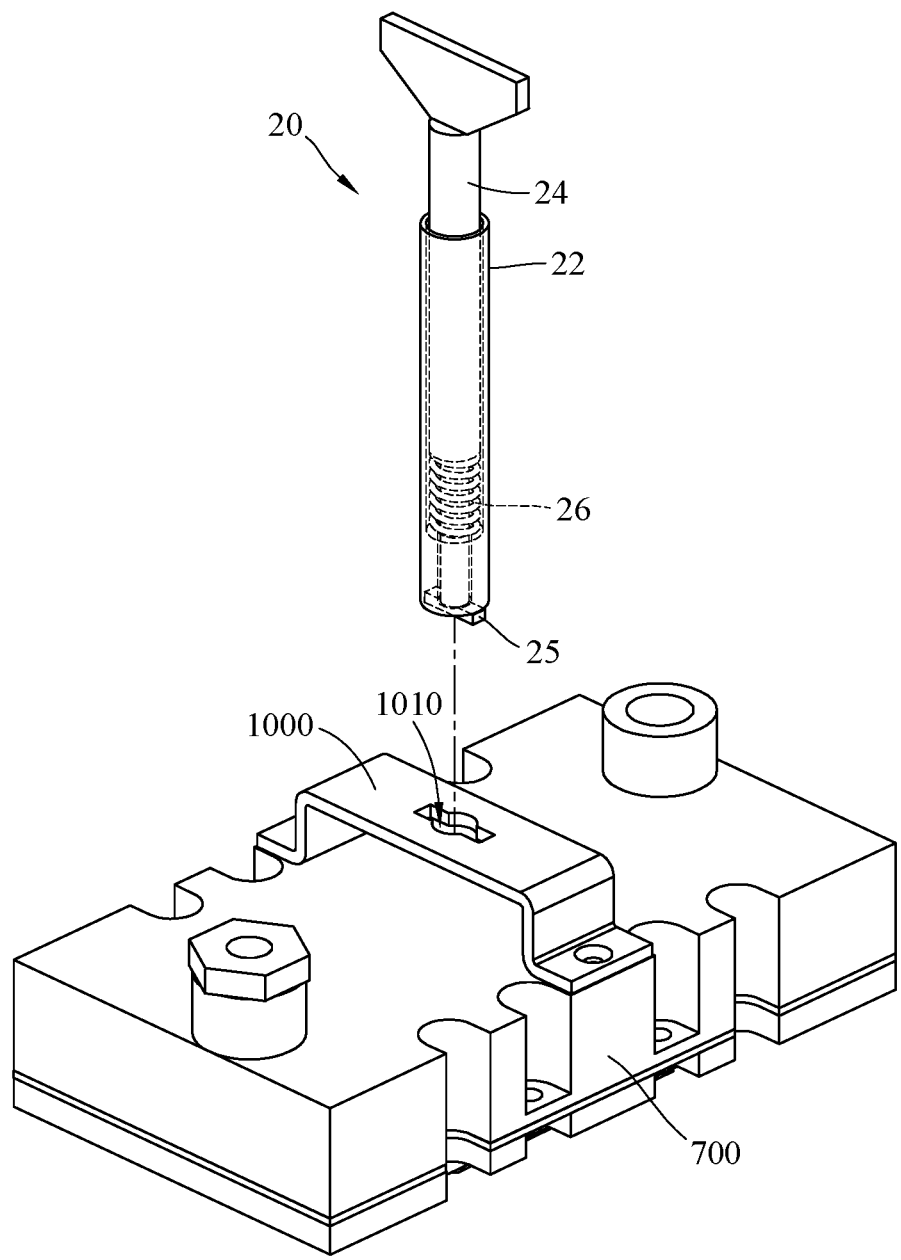
FIGS. 5 and 6 show an engagement between the cold plate assembly in FIG. 4 and a pick-and-place tool.
Figure 6:
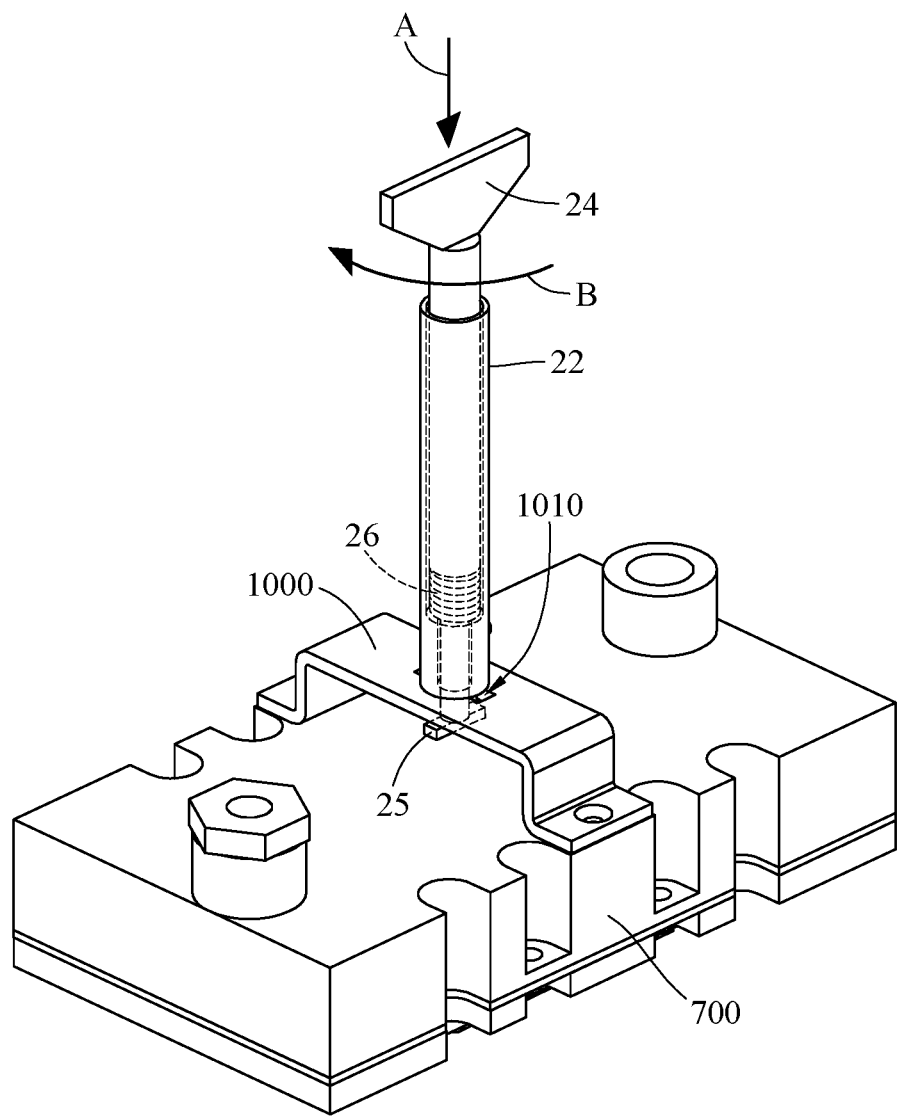

Refer to FIGS. 5 and 6, where FIGS. 5 and 6 show an engagement between the cold plate assembly in FIG. 4 and a pick-and-place tool 20.

As shown in FIG. 5, the pick-and-place tool 20 is about to be engaged with the assistance bracket 1000 of the cold plate assembly. The pick-and-place tool 20 includes a sleeve 22, a movable component 24, and an elastic component 26. The sleeve 22 is sleeved on the movable component 24 and accommodates a part of the movable component 24 therein. The movable component 24 is slidably and rotatably disposed on the sleeve 22, and the movable component 24 has an engagement structure 25 located at one end of the movable component 24. One end of the elastic component 26 is fixed to the sleeve 22, and another end of the elastic component 26 is fixed to the movable component 24, such that the engagement structure 25 is constantly located at a position relatively close to the sleeve 22 when there is no another force exerted on the movable component 24.

Then, as shown in FIG. 6, the movable component 24 is pressed downwards relative to the sleeve 22 along a direction A, such that the engagement structure 25 passes through the engagement hole 1010 of the assistance bracket 1000. Then, the movable component 24 is rotated along a direction B, such that the engagement structure 25 is hooked on the assistance bracket 1000. By doing so, the cold plate can be moved upwards or downwards by holding the pick-and-place tool 20.

In this embodiment, the pick-and-place tool 20 has only one engagement structure 25 for picking up or placing down only one cold plate at a time, but the invention is not limited thereto; in some other embodiments, the pick-and-place tool may have a plurality of engagement structures for picking up or placing down multiple cold plates simultaneously.

According to the server, the liquid cooling device, and the cold plate assembly as discussed in the above embodiments, the liquid cooling device is provided in the server, such that the heat dissipation requirement can be satisfied while reducing the quantity of fans or reducing the rotation speed of the fans, thereby reducing noise generated from the fans.

Moreover, since coolant flowing in the liquid cooling device has a desirable specific heat capacity and a high heat conductivity, heat transfer efficiency of the coolant is approximately 1000 to 3000 times of that of air. Therefore, the liquid cooling device provided in the server can be disposed on the main heat source, and other heat sources may be still cooled by the fans, which improves the heat dissipation efficiency of the server.

Furthermore, since the heat dissipation efficiency of liquid cooling per volume is better than the heat dissipation efficiency of air cooling per volume, in the same heat dissipation efficiency, the volume of the liquid cooling device is smaller than that of the air cooling device. Therefore, the liquid cooling device is prevented from interfering installations or removals of components in the server.

In addition, the first cold plates and the second cold plates are connected to the same water divider, such that the quantity of quick connectors can be reduced, and the coolant can preferentially flow through the second cold plates thermally coupled to the graphics chips that consume more power, thereby increasing the heat dissipation efficiency of the liquid cooling device.

On the other hand, the assistance bracket is provided on the cold plate, such that the assistance bracket facilitates the installation or removal of the cold plate by using the pick-and-place tool.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid cooling device, comprising:
   a plurality of first cold plates, each having a first fluid inlet and a first fluid outlet;
   a plurality of second cold plates, each having a second fluid inlet and a second fluid outlet;
   a water divider, having an outer inlet connector, an outer outlet connector, a plurality of inner inlet connectors, and a plurality of inner outlet connectors, wherein the plurality of inner inlet connectors are in fluid communication with the outer inlet connector, and the plurality of inner outlet connectors are in fluid communication with the outer outlet connector;
   a first inlet pipe, connecting one of the plurality of inner inlet connectors and the first fluid inlet of one of the plurality of first cold plates;
   a first outlet pipe, connecting one of the plurality of inner outlet connectors and the first fluid outlet of another one of the plurality of first cold plates;
   a plurality of first connection pipes, each connecting the first fluid inlet and the first fluid outlet of different two of the others of the plurality of first cold plates;
   a plurality of second inlet pipes, respectively connecting the others of the plurality of inner inlet connectors and the second fluid inlets of some of the plurality of second cold plates;
   a plurality of second outlet pipes, respectively connecting the others of the plurality of inner outlet connectors and the second fluid outlets of some of the plurality of second cold plates; and
   a plurality of second connection pipes, each connecting the second fluid inlet and the second fluid outlet of different two of the others of the plurality of second cold plates.

2. The liquid cooling device according to claim 1, wherein the plurality of first cold plates comprises six first cold plates, and the six first cold plates are arranged along a straight line.

3. The liquid cooling device according to claim 2, wherein the plurality of second cold plates comprises eight second cold plates, and the eight second cold plates are arranged in an array of 2×4.

4. A server, comprising:
   a casing;
   a motherboard, disposed on the casing;
   a plurality of graphics chips, disposed in the motherboard;

a plurality of bridge chips, disposed on the motherboard and connected to the plurality of graphics chips; and a liquid cooling device, disposed in the casing, the liquid cooling device comprising:

a plurality of first cold plates, respectively and thermally coupled to the plurality of bridge chips and each having a first fluid inlet and a first fluid outlet;

a plurality of second cold plates, respectively and thermally coupled to the plurality of graphics chips and each having a second fluid inlet and a second fluid outlet;

a water divider, having an outer inlet connector, an outer outlet connector, a plurality of inner inlet connectors, and a plurality of inner outlet connectors, wherein the plurality of inner inlet connectors are in fluid communication with the outer inlet connector, and the plurality of inner outlet connectors are in fluid communication with the outer outlet connector;

a first inlet pipe, connecting one of the plurality of inner inlet connectors and the first fluid inlet of one of the plurality of first cold plates;

a first outlet pipe, connecting one of the plurality of inner outlet connectors and the first fluid outlet of another one of the plurality of first cold plates;

a plurality of first connection pipes, each connecting the first fluid inlet and the first fluid outlet of different two of the others of the plurality of first cold plates;

a plurality of second inlet pipes, respectively connecting the others of the plurality of inner inlet connectors and the second fluid inlets of some of the plurality of second cold plates;

a plurality of second outlet pipes, respectively connecting the others of the plurality of inner outlet connectors and the second fluid outlets of some of the plurality of second cold plates; and a plurality of second connection pipes, each connecting the second fluid inlet and the second fluid outlet of different two of the others of the plurality of second cold plates.

5. The server according to claim 4, wherein the plurality of first cold plates comprises six first cold plates, and the six first cold plates are arranged along a straight line.

6. The server according to claim 5, wherein the plurality of second cold plates comprises eight second cold plates, and the eight second cold plates are arranged in an array of 2×4.

7. The server according to claim 4, further comprising a fan assembly, wherein the fan assembly is disposed in the casing and is configured to generate an airflow towards the motherboard.

* * * * *